(12) United States Patent
Bobde

(10) Patent No.: US 8,558,276 B2
(45) Date of Patent: *Oct. 15, 2013

(54) BOTTOM SOURCE NMOS TRIGGERED ZENER CLAMP FOR CONFIGURING AN ULTRA-LOW VOLTAGE TRANSIENT VOLTAGE SUPPRESSOR (TVS)

(75) Inventor: Madhur Bobde, San Jose, CA (US)

(73) Assignee: Alpha and Omega Semiconductor, Inc., Sunnyvale, CA (US)

( * ) Notice: Subject to any disclaimer, the term of this patent is extended or adjusted under 35 U.S.C. 154(b) by 926 days.

This patent is subject to a terminal disclaimer.

(21) Appl. No.: 12/456,555

(22) Filed: Jun. 17, 2009

(65) Prior Publication Data

US 2010/0321840 A1   Dec. 23, 2010

(51) Int. Cl.
*H01L 29/02* (2006.01)

(52) U.S. Cl.
USPC ........... 257/143; 257/173; 257/328; 257/361; 257/362; 257/565; 257/E21.417; 257/E21.618

(58) Field of Classification Search
USPC ......... 257/361–362, 105, 143, 173, 175, 565, 257/E21.417, E21.618
See application file for complete search history.

(56) References Cited

U.S. PATENT DOCUMENTS 8,000,124 B2 * 8/2011 Bobde .............................. 365/72

* cited by examiner

*Primary Examiner* — Kenneth Parker
*Assistant Examiner* — Jose R Diaz
(74) *Attorney, Agent, or Firm* — Bo-In Lin

(57) ABSTRACT

A low voltage transient voltage suppressing (TVS) device supported on a semiconductor substrate supporting an epitaxial layer thereon. The TVS device further includes a bottom-source metal oxide semiconductor field effect transistor (BS-MOSFET) comprises a trench gate surrounded by a drain region encompassed in a body region disposed near a top surface of the semiconductor substrate wherein the drain region interfaces with the body region constituting a junction diode and the drain region encompassed in the body region on top of the epitaxial layer constituting a bipolar transistor with a top electrode disposed on the top surface of the semiconductor functioning as a drain/collector terminal and a bottom electrode disposed on a bottom surface of the semiconductor substrate functioning as a source/emitter electrode. The body regions further comprises a surface body contact region electrically connected to a body-to-source short-connection thus connecting the body region to the bottom electrode functioning as the source/emitter terminal. The gate may be shorted to the drain for configuring the BS-MOSFET transistor into a two terminal device with a gate-to-source voltage equal to a drain-to-source voltage. The drain/collector/cathode terminal disposed on top of the trench gate turns on the BS-MOSFET upon application of a threshold voltage of the BS-MOSFET thus triggering the bipolar transistor for clamping and suppressing a transient voltage substantially near a threshold voltage of the BS-MOSFET.

12 Claims, 11 Drawing Sheets

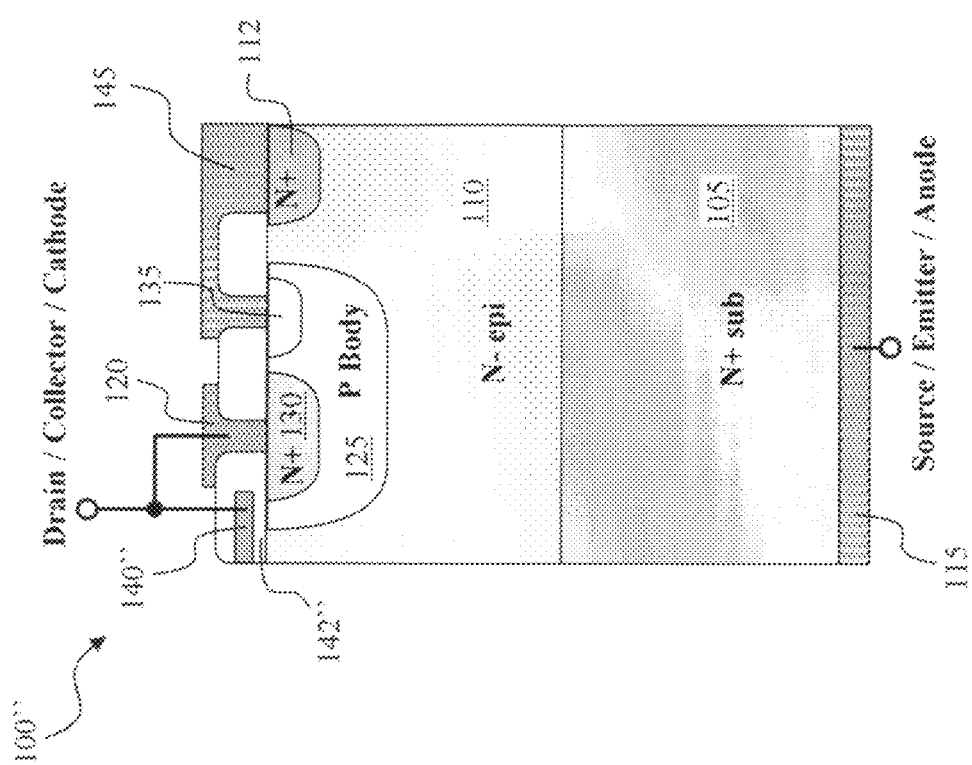

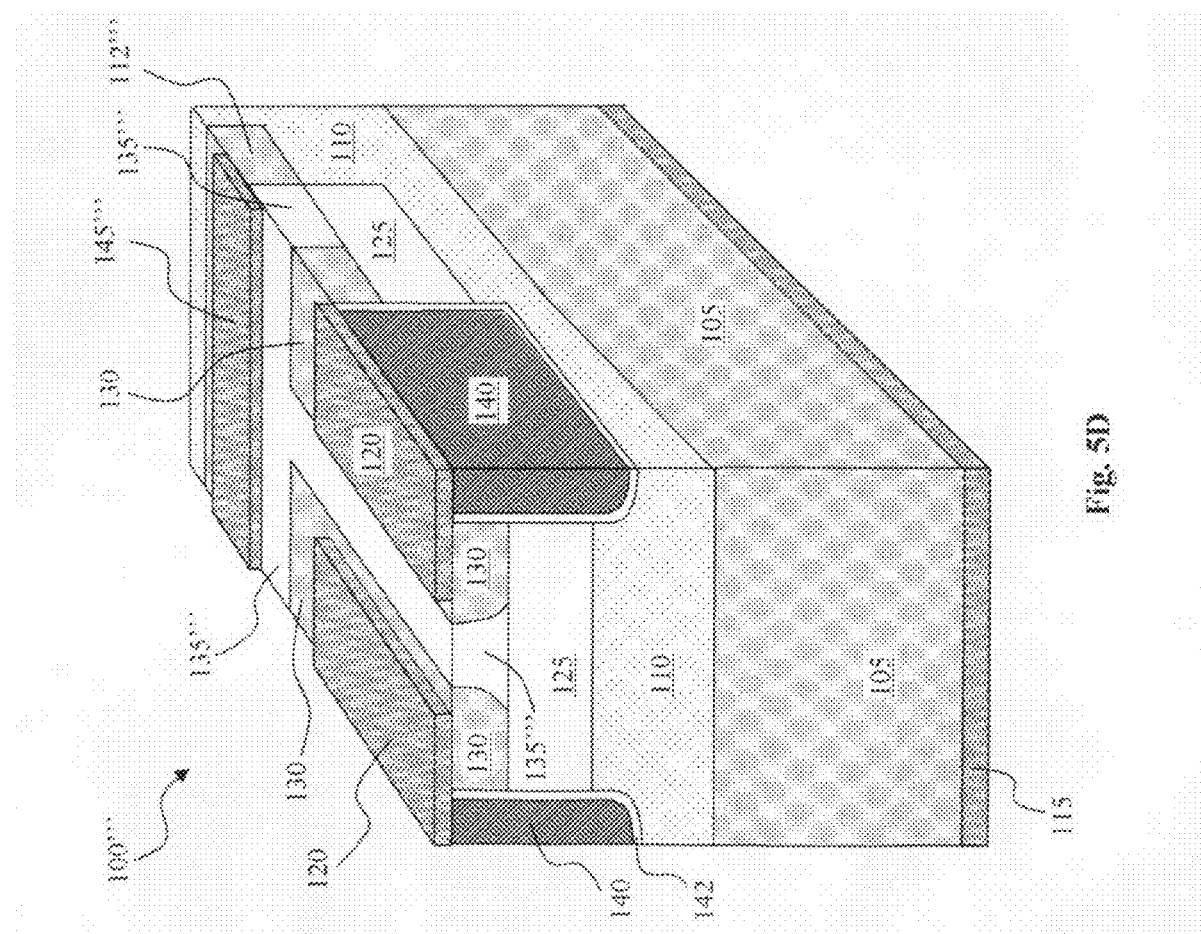

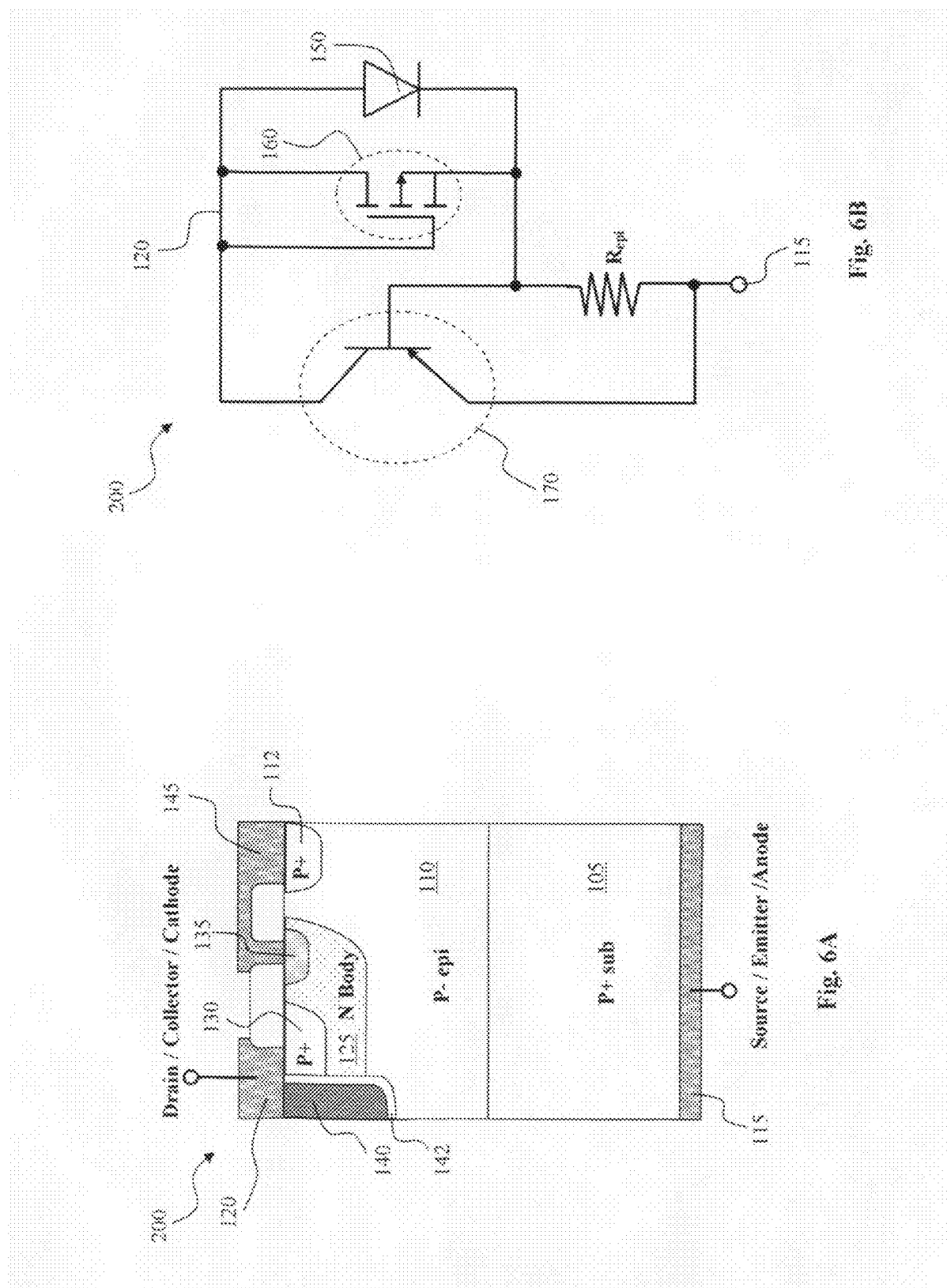

BOTTOM SOURCE NMOS TRIGGERED ZENER CLAMP FOR CONFIGURING AN ULTRA-LOW VOLTAGE TRANSIENT VOLTAGE SUPPRESSOR (TVS)

BACKGROUND OF THE INVENTION

1. Field of the Invention

The invention relates generally to a circuit configuration and method of manufacturing a transient voltage suppressor (TVS). More particularly, this invention relates to an improved circuit configuration and method of manufacturing an improved transient voltage suppressor (TVS) for low voltage protection by implementing a bottom source NMOS triggered Zener clamp configuration in the TVS circuit.

2. Description of the Relevant Art

The transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and secondary lightning, an unexpected and an uncontrollable high voltage may accidentally strike onto the circuit. The TVS devices are required to serve the protection functions to circumvent the damages that are likely to occur to the integrated circuits when such over voltage conditions occur. As increasing number of devices are implemented with the integrated circuits that are vulnerable to over voltage damages, demands for TVS protection are also increased. Exemplary applications of TVS can be found in the USB power and data line protection, Digital video interface, high speed Ethernet, Notebook computers, monitors and flat panel displays.

FIG. 1A shows a typical commercially available two-channel TVS array 10. There are two sets of steering diodes, i.e., diodes 15-H and 15-L and 20-H and 20-L respectively for each of the two input/output (I/Os) terminals I/O-1 and I/O-2. Furthermore, there is a Zener diode, i.e., diode 30, with a larger size to function as an avalanche diode from the high voltage terminal, i.e., terminal Vcc, to the ground voltage terminal, i.e., terminal Gnd. The high side diodes 15-H and 20-H provide a forward bias and are clamped by the large Vcc-Gnd diodes, e.g., the Zener diode 30, when a positive over-voltage strikes on one of the I/O or Vcc pads. The steering diodes 15-H, and 15-L and 20-H and 20-L are designed with a small size to reduce the I/O capacitance and thereby reducing the insertion loss in high-speed lines such as fast Ethernet applications. FIG. 1B shows the reverse current $I_R$ versus reverse blocking voltage VBR characteristics of the two-channel TVS Diode Array between the Vcc and the ground voltage of the TVS 10 shown in FIG. 1A. The reverse current $I_R$ as that shown in the diagram of FIG. 1B represents a reverse current conducted through the Zener diode, i.e., between Vcc and GND. Here it is assumed that the reverse BV of each steering diode is higher than the reverse BV of the Zener diode. But note that at high currents when the Vcc to Gnd pad voltage is equal or higher than the summation of the reverse BV of the steering diodes then the current would also flow through all the two series steering diode paths. Since the Zener diode has higher resistance per unit area compared with bipolar junction transistors (BJT) or silicon controlled rectifiers (SCR), this is actually a disadvantage at higher currents because the steering diodes also have to be rugged in reverse conduction. In the case of the SCR the Zener clamp voltage is lower at higher currents and hence the steering diodes paths will not conduct. The breakdown voltage of the Vcc-Gnd diode 30 and the steering diodes 15 and 20 should be greater than the operating voltage (Vrwm) so that these diodes only turn-on during the voltage transients. The problem with the Vcc-Gnd clamp diodes is that typically these diodes are very resistive in reverse conduction mode and require large area to reduce resistance. As shown in FIG. 1B, the high resistance leads to the increase of BV at high current. This is not desirable as high BV not only causes the break down of steering diodes as described above but also causes damage to the circuit the TVS device intends to protect. The requirement to have large diode size thus limits further miniaturization of a device when such TVS circuit is implemented.

One common method used in the integrated circuits to circumvent this drawback is to use a Zener triggered NPN as the clamp device as that shown in FIG. 2A. The TVS circuit 50 shown in FIG. 2A comprises a NPN bipolar transistor 55 connected in parallel to a Zener diode 60 to function as a Zener triggered NPN bipolar TVS device. FIG. 2B shows a current-voltage (W) diagram for the Zener triggered NPN diode device. FIG. 2B illustrates that the TVS circuit begins conducting when the breakdown voltage of the Zener diode 60 is reached. When the base-emitter voltage is high enough, the NPN bipolar turns-on and snaps back to a lower voltage called the BVceo or holding voltage where BVceo stands for collector to emitter breakdown voltage with base left open. However, in a device that implements a TVS circuit, the snapback phenomenon is not desirable. The snap-back creates a sudden drop of the reverse voltage that often causes the circuit oscillations due to negative resistance, and can even drop into the operating voltage range, which is undesirable.

In order to resolve the snap-back difficulties, commonly owned patent application Ser. No. 11/444,555 was previously submitted on May 31, 2006, and issued May 26, 2009 as U.S. Pat. No. 7,538,997. The disclosures made in that Application are hereby incorporated by reference in this patent application. The TVS circuits as described in the patent application Ser. No. 11/444,555 are implemented to protect a device operated at a voltage of approximately five volts and are useful for 5V device protection. However, in addition to the technical difficulties related to the sudden large voltage drops as discussed above, there is a need to reduce the transient voltage protection at a further reduced voltage such as 3.3 volts. The TVS circuits disclosed have been effective to protective circuit operated at about five volts, however, would not provide the required protection when the operational voltage is further reduced below five volts because of its high triggering and clamping voltage.

In another co-pending patent application Ser. No. 11/712,317 previously submitted on Feb. 28, 2007 by a common inventor of this application further disclosed another new TVS circuit to provide an improved clamping at a further reduced voltage such that TVS protection can be provided for devices operated 3.3 to 5 volts with low leakage implemented by stacking PMOS diodes. The TVS protection circuit disclosed in that Application includes a MOS triggering TVS with tunable low snap-back voltage wherein the MOS-SCR is operated without a negative resistance while providing good clamping factor. The TVS protection circuit further includes high side diodes with NBL to suppress the I/O-to-I/O latch-up such that the device performance is further improved. However, the MOS-SCR triggered devices have more complicated structure that requires the device to have greater die area. These types of devices also require IC based manufacturing processes that requires many more masking steps (about 2×-3×) as compared to a DMOS type of process thus resulting in higher production costs.

In another co-pending patent application Ser. No. 11/982, 526 previously submitted on Nov. 1, 2007, the Applicant of this invention further disclosed another improved TVS device structure to have an improved clamping at a further reduced voltage that TVS protection can be provided for devices operated at a voltage below 5 volts. The TVS protection circuit is implemented with a potential barrier based TVS structure thus providing simplified configuration for manufacturing the TVS device with simple DMOS type process without requiring the more expensive and complicated IC processes. Even with a lower triggering voltage disclosed in this application, further device protections for triggering voltage below 2.5 volts are still necessary. Additionally, there are concerns with the reliability of JFET based potential barrier triggering mechanism.

For better understanding of this invention, the descriptions of the FIGS. 3A to 3B from patent application Ser. No. 11/712,317 below are provided as background reference information of the TVS disclosed previously submitted and assigned to a common assignee of this Application.

FIG. 3A is a circuit diagram for showing a TVS as an exemplary embodiment of a prior art invention that implements a trigger circuit 180 for providing signal for triggering a main clamp circuit 190. The trigger circuit 180 includes four stacked PMOS transistors 181-1 to 181-4 with body effect wherein each PMOS transistor provide the option to have its body region tied to its source or to Vcc to create a reverse bias between its source and body that would increase the gate threshold voltage. By adjusting the number of PMOS transistor and the options of connecting the body of the PMOS transistors to its source or Vcc, the trigger voltage can be adjusted. In normal operation voltage, the stacking PMOS 181-1 to 181-4 are off because Vcc is not high enough to turn on the stacking PMOS transistors and therefore there is no current passing through resistor 182. The gate voltage of the NMOS 186 is low and below its threshold voltage and the NMOS 186 is turned off because the there is no current passing through the resistor 182 that is connected across the gate and the source of the NMOS transistor 186. The CMOS transistors, e.g., the PMOS 184 and the NMOS 185, has a low output voltage since the Vcc on the CMOS gate turns on the NMOS 185 but turns off the PMOS 184 and the output of the CMOS is connected to the ground through NMOS 185. The low voltage output turns off the trigger NMOS transistor 191 thus turns off the main clamp circuit.

Once a voltage transient event takes place, the voltage imposed onto the stacked PMOS 181-1 to 184-4 exceeds the sum of gate threshold voltages that turns on all of the stacked PMOS transistors causing a current to pass through the resistor 182. When this transient voltage is high enough and exceeds the trigger voltage which is equivalent to the sum of all the stacked PMOS threshold plus the threshold of NMOS 186, the current passing through the stacked PMOS and resistor 182 will increase until the voltage across the gate of the transistor 186 reach its threshold which consequently turns on the transistor 186. Once the transistor 186 conducts then the current passes through the resistor 183 and NMOS 186 to the ground. The ground voltage thus applied to CMOS gate turns off the NMOS 185 and turns on the PMOS 184 and the output voltage of CMOS is pulled up to Vcc thus triggers the main clamp circuit 190. FIG. 3B shows the output voltage of the trigger circuit 180 versus the input voltage Vcc. In FIG. 3B, the curve 287 corresponds to the trigger circuit output with three PMOS with body effect and line 288 corresponds to the trigger circuit output with four PMOS with body effect. The trigger voltage changes from about 3 Volts to 5 Volts as the number of stacked PMOS transistor increases from three to four. Below the trigger voltage, the output of trigger circuit 180 is zero volts while it increases linearly as the input voltage Vcc exceeds the designated trigger voltage. In normal working voltage range, the leakage current of trigger circuit 180 is also reduced. FIG. 3C shows the leakage current of trigger circuit 180 verses input voltage Vcc. At normal working voltage of 3.3 Volts, the leakage current is only tens of nano Amps, compare to a Zener diode triggered at similar voltage which has a leakage of micro Amps, one to two order of magnitude improvement is achieved.

With the trigger NMOS 191 turned on, the current passes through the resistor 193 and NMOS 191 and as the current increases so is the voltage drop across the emitter base junction of the PNP bipolar junction transistor (BJT). When the drop in the resistor 193 reaches a voltage of 0.6V then the base-emitter junction of the PNP transistor 194 is forward biased and the PNP transistor 194 turns on. Now the collector current of the PNP transistor flows through the resistor 195 connected between the emitter and base of the NPN transistor 192. When the potential drop in this resistor 195 reaches a voltage of 0.6V then the emitter of the NPN transistor 192 begins to conduct and a SCR mode operation is initiated. A protection diode 187 connecting between the CMOS output and ground is optional in case a high voltage surge is coupled into the CMOS output through a gate drain capacitor of trigger NMOS 191.

Therefore, the main clamp circuit 190 is a MOS trigger SCR that comprises a trigger NMOS 191 connected in series with a resistor 193 in parallel to a PNP bipolar transistor 194. The threshold voltage, of the triggering NMOS 191 is less than or equal to the BVceo of the PNP bipolar transistor 194 where BVceo stands for collector to emitter breakdown voltage with the base left open.

However, as pointed out earlier, this prior art requires several NMOS & PMOS transistors to implement the trigger circuit, and the MOS gated SCR. This requires the use of a standard CMOS process for fabrication and a large die to layout all the transistors and resistors in the circuit. In addition, the trigger circuit has many stages, which may affect the overall response time of the TVS circuit. This brings out the need for implementing a simpler device structure that achieves low voltage trigger and clamping and requires a simple fabrication process.

Therefore, a need still exists in the fields of circuit design and device manufactures for providing a new and improved circuit configuration and manufacturing method to resolve the above-discussed difficulties. Specifically, a need still exists to provide new and improved TVS circuits that can perform good voltage clamping function, occupying smaller areas and eliminating or reducing snapback voltage variations at a further reduced voltage down to a level below 2.5 volts to five volts for reliable protection of device operated at lower voltage level.

SUMMARY OF THE PRESENT INVENTION

It is therefore an aspect of the present invention to provide an improved TVS device structure to have an improved clamping at a further reduced voltage such that TVS protection can be provided for devices operated below 2.5 volts such that the above discussed limitations and difficulties can be resolved.

Another aspect of this invention is to provide TVS protection circuit with tunable low trigger voltage below 2.5 volts with low leakage and reliable triggering action by implementing a bottom source NMOS triggering Zener clamp such that reliable protection with reduced device area and simplified configuration can be achieved.

Another aspect of this invention is to provide TVS protection circuit with a tunable low trigger voltage below 5 volts by implementing the TVS protection circuit with a bottom source NMOS based trigger TVS structure thus providing simplified configuration such that the TVS device can be manufactured by simple DMOS type process without requiring the more expensive and complicated IC processes.

Briefly in a preferred embodiment this invention discloses a low voltage transient voltage suppressing (TVS) device supported on a semiconductor substrate supporting an epitaxial layer thereon. The TVS device further includes a bottom-source metal oxide semiconductor field effect transistor (BS-MOSFET) comprising a gate (which can be a trench gate or a planar gate) adjacent to a drain region encompassed in a body region disposed near a top surface of the semiconductor substrate/epitaxial layer wherein the drain region interfacing with the body region constituting a junction diode and the drain region encompassed in the body region on top of the epitaxial layer constituting a bipolar transistor with a top electrode disposed on the top surface of the semiconductor functioning as a drain/collector terminal and a bottom electrode disposed on a bottom surface of the semiconductor substrate functioning as a source/emitter electrode. The epitaxial layer and the semiconductor substrate act as the source/emitter region. The body region further comprises a surface body contact region electrically connected to a body-to-source short-connection thus connecting the body region to the bottom electrode functioning as the source/emitter terminal. The drain/collector may also be shorted to the gate for configuring the BS-MOSFET transistor into a two terminal device with a gate-to-source voltage equal to a drain-to-source voltage. The drain/collector terminal turning on the BS-MOSFET upon application of a threshold gate voltage of the BS-MOSFET, with the BS-MOSFET then triggering the bipolar transistor for clamping and suppressing a transient voltage substantially near a threshold voltage of the BS-MOSFET. In an exemplary embodiment, the semiconductor substrate has N+ doping and supports an N-type epitaxial layer thereon for disposing a BS-NMOSFET in parallel to an NPN bipolar transistor in the semiconductor substrate. In another exemplary embodiment, the TVS device clamps at a voltage substantially below three volts (3V). In another exemplary embodiment, the trench gate having a truncated length along a third dimension of the semiconductor substrate for reducing a total area of the BS-MOSFET and increasing the total area of the bipolar transistor. By changing the ratio of area the BS-MOSFET to the area of the bipolar transistor, the amount of current required to flow through the BS-MOSFET to turn on the bipolar transistor can be adjusted. In another exemplary embodiment, the surface body contact region electrically connected to a metal layer on the top surface of the semiconductor substrate to function as the body-to-source short-connection. In another exemplary embodiment, the surface body contact region electrically connected to a dopant region disposed in the epitaxial layer as a part of the body-to-source short-connection thus electrically connecting the body region to the bottom source/emitter terminal. In another exemplary embodiment, the semiconductor substrate has a P+ conductivity type and supports a P-type epitaxial layer thereon for disposing a BS-PMOSFET in parallel to a PNP bipolar transistor in the semiconductor substrate.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 5B, 5C, and 5D are a perspective view, a cross sectional view, and a perspective view, respectively, for showing the configurations of alternate embodiments of this invention.

FIGS. 6A and 6B are respectively a cross sectional view and an equivalent circuit diagram of a TVS device structure of this invention having reversed conductivity types as FIGS. 4A and 4B.

DETAILED DESCRIPTION OF THE INVENTION

Figure 1B:
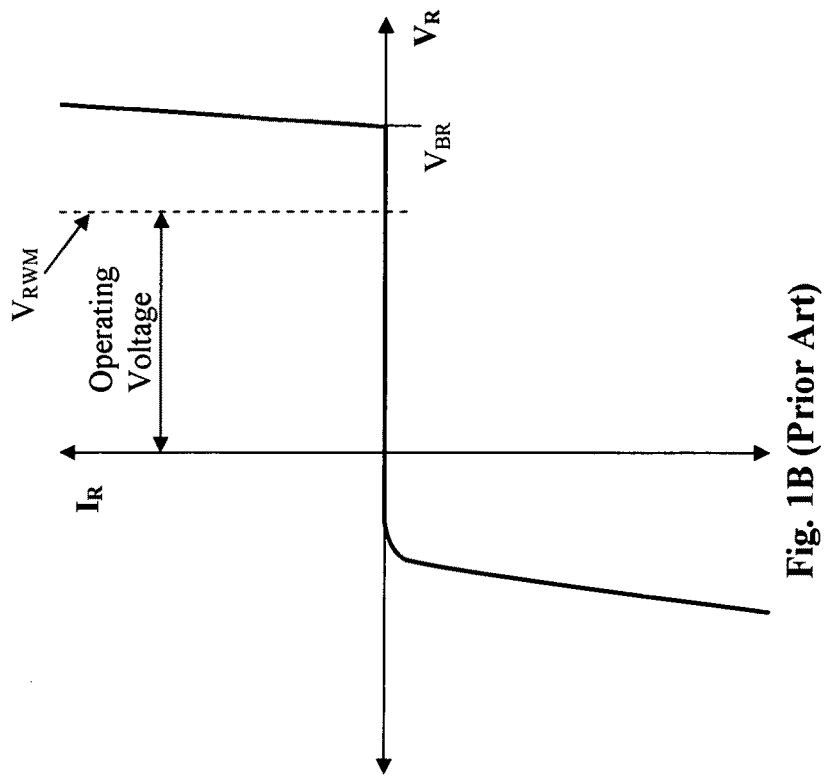
FIG. 1A is a circuit diagram for showing a conventional TVS device and FIG. 1B is an I-V diagram, i.e., a current versus voltage diagram, for illustrating the reverse characteristics of the TVS device of FIG. 1A.
Figure 1A:
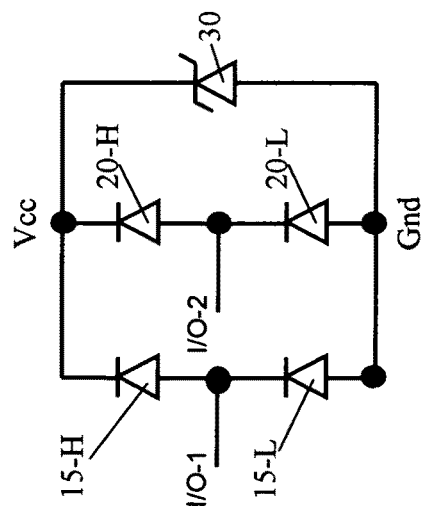
Figure 2B:
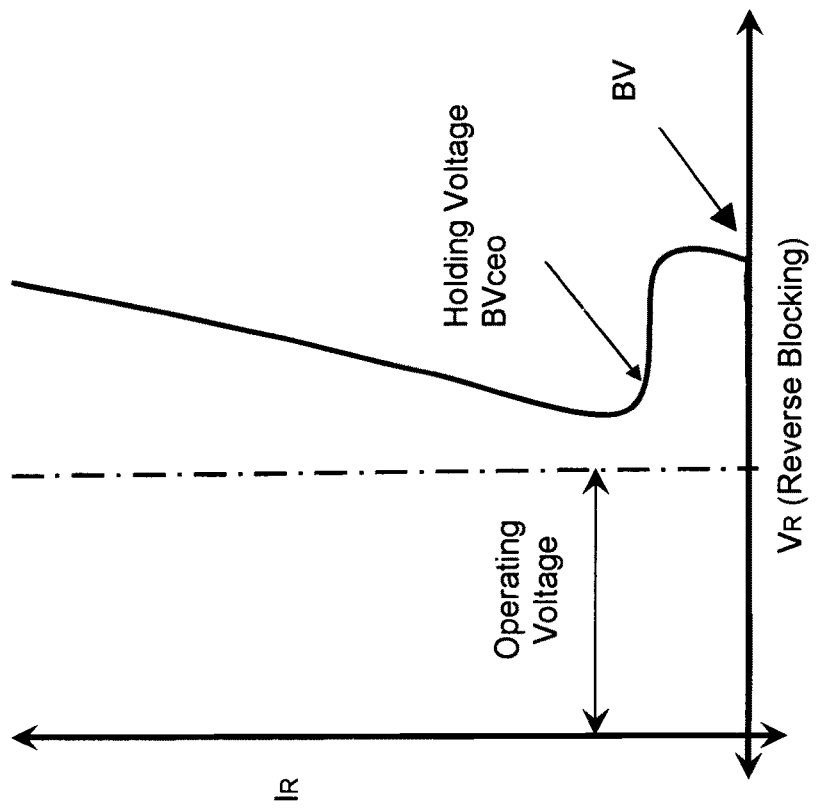
FIG. 2A is a circuit diagram for showing another conventional TVS device and FIG. 2B is an I-V diagram for illustrating the reverse characteristics of that TVS device with the voltage showing a sudden snap-back voltage drop at the time when a current conduction over the NPN bipolar transistor is triggered.
Figure 2A:
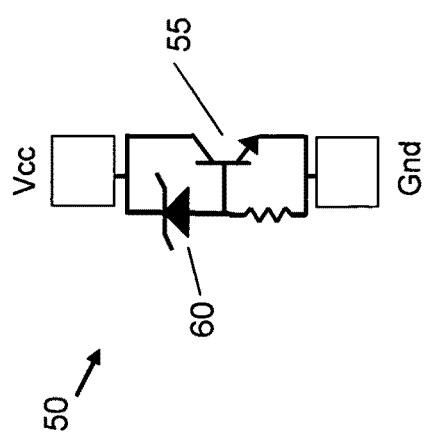
Figure 3A:
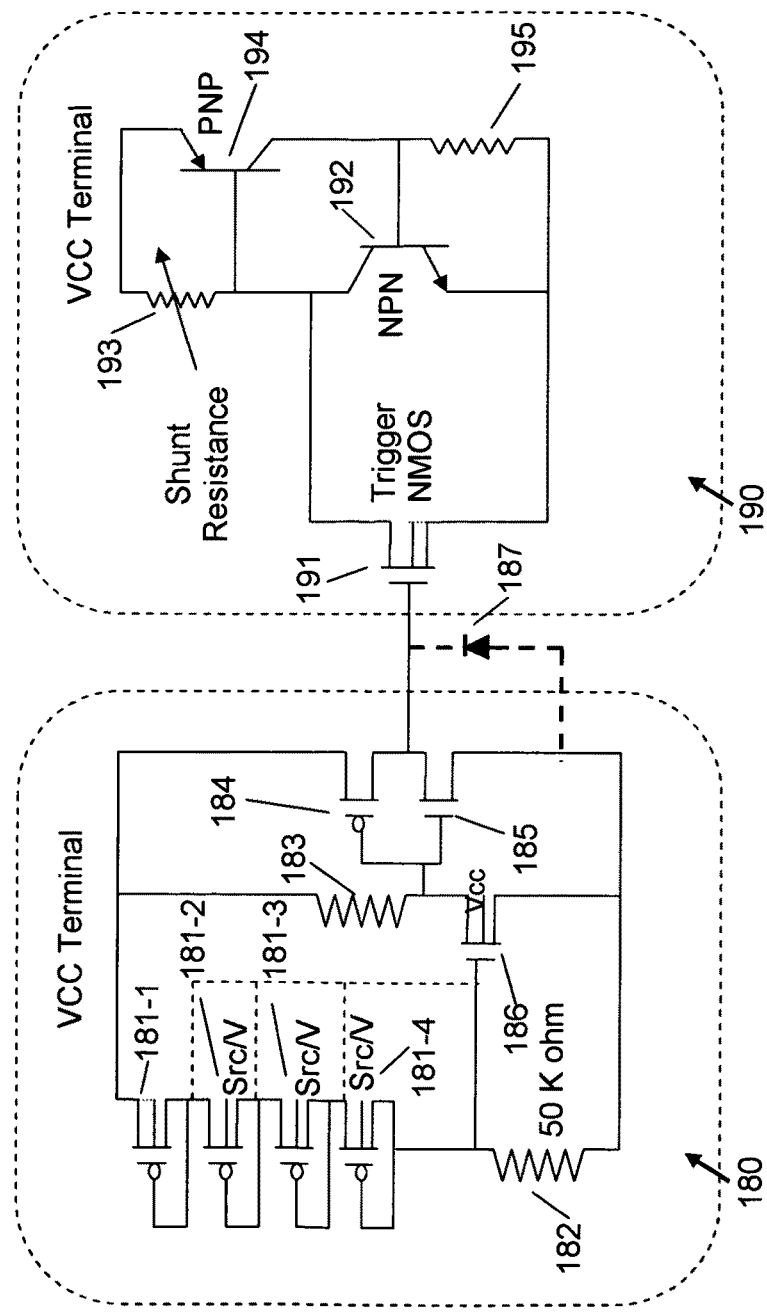
FIG. 3A is a circuit diagram for depicting a MOS triggered TVS of a prior art for triggering and protecting a device operated at a voltage below 5 Volts.
Figure 3B:
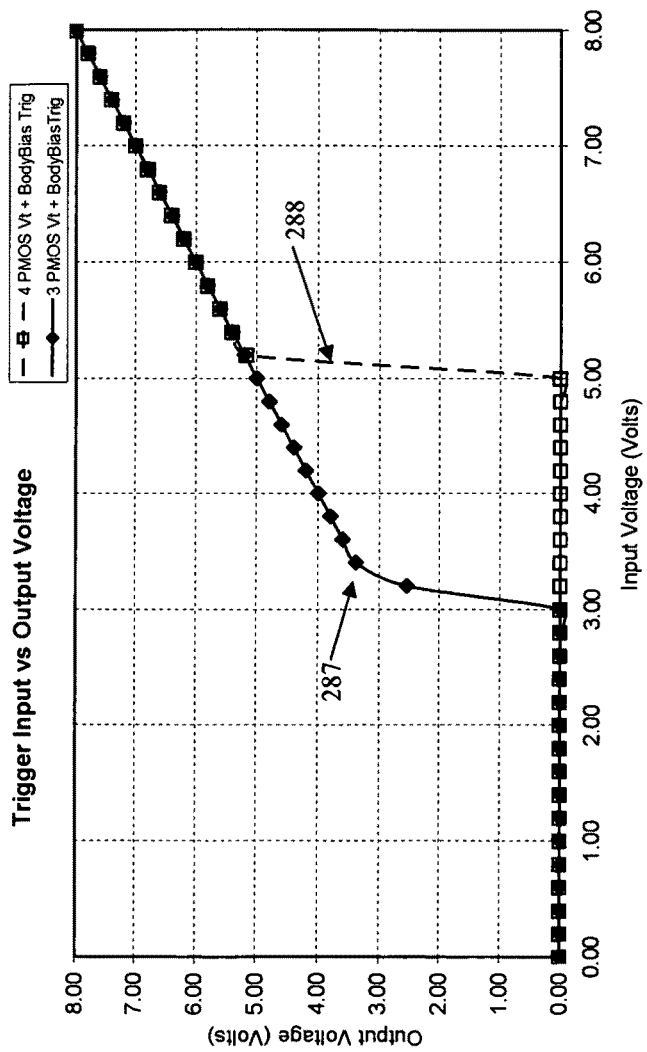
FIG. 3B is a prior art diagram for showing the variation of the input voltage versus output voltage of the trigger circuit with three and four stacked PMOS transistors.
Figure 4B:
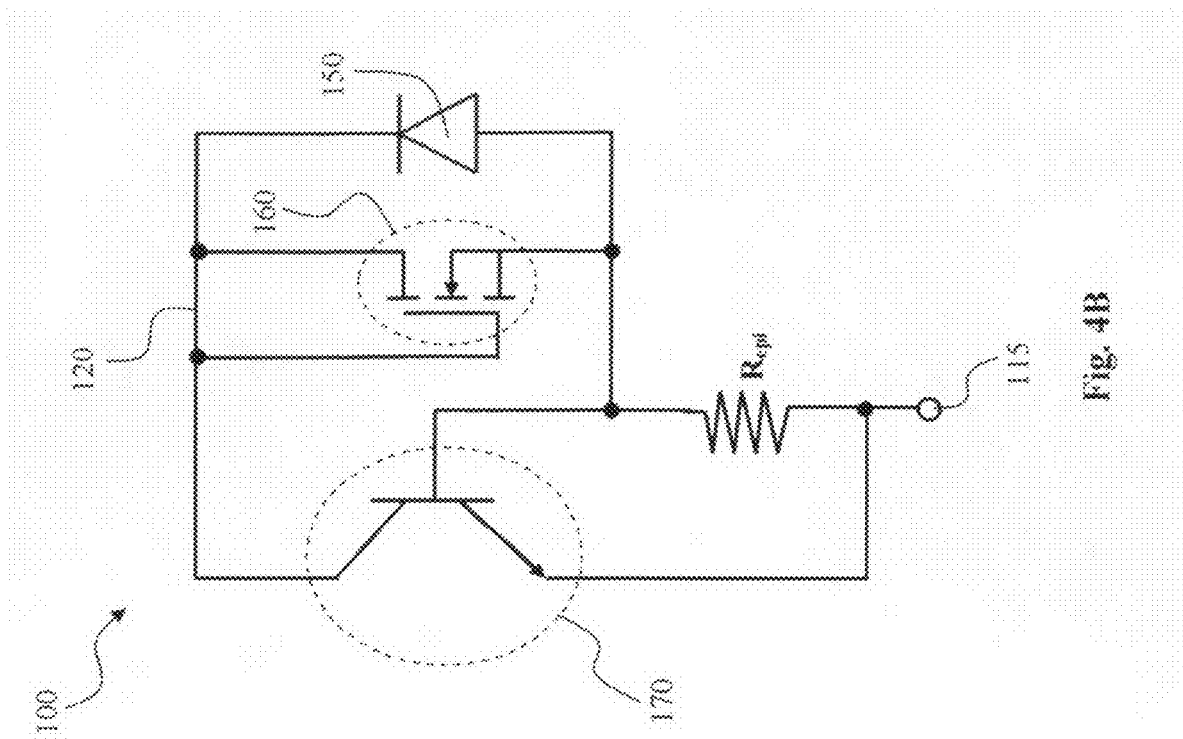
FIGS. 4A and 4B are respectively a cross sectional view and an equivalent circuit diagram of a TVS device structure of this invention.
Figure 4A:
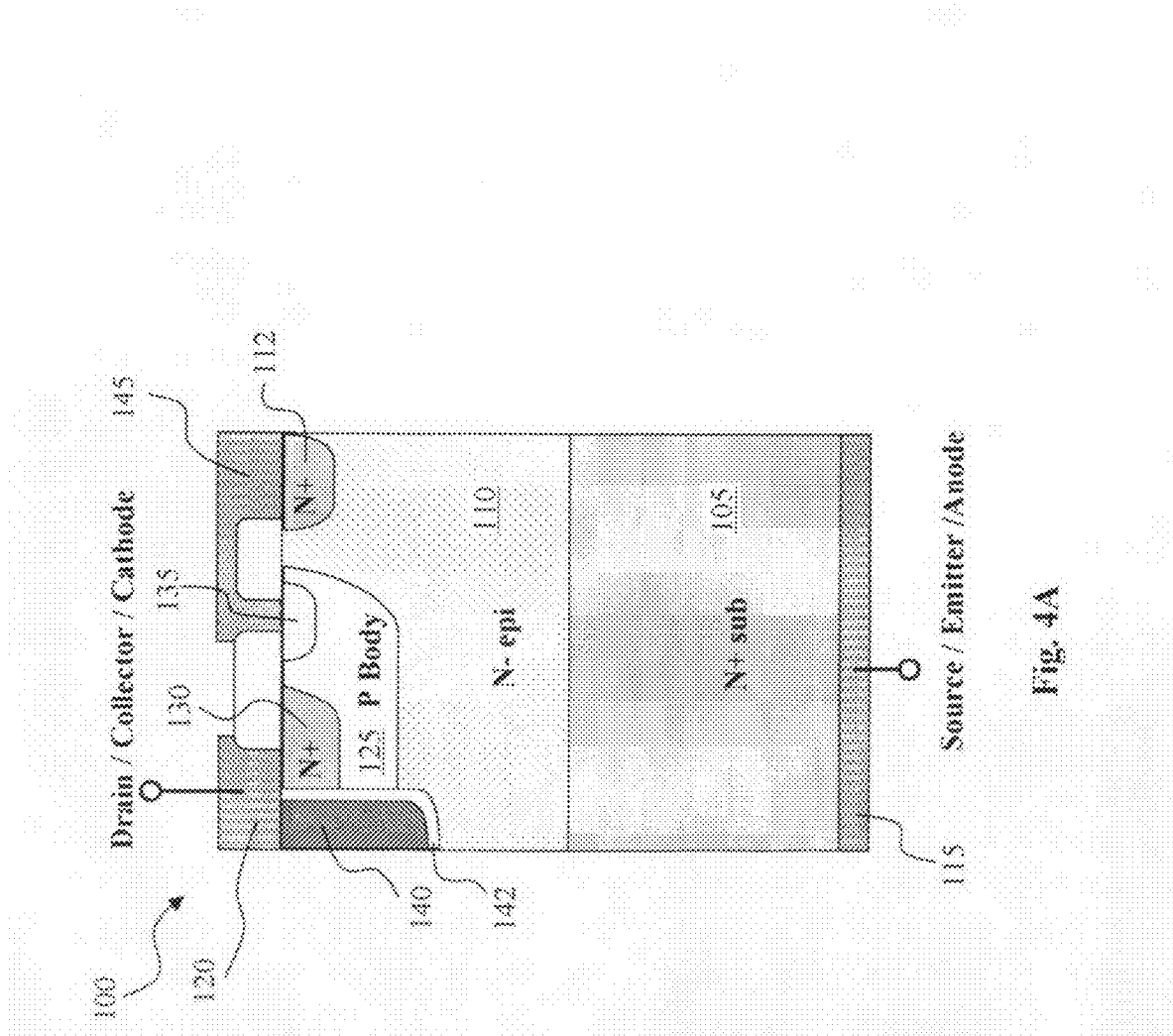
Figure 4C:
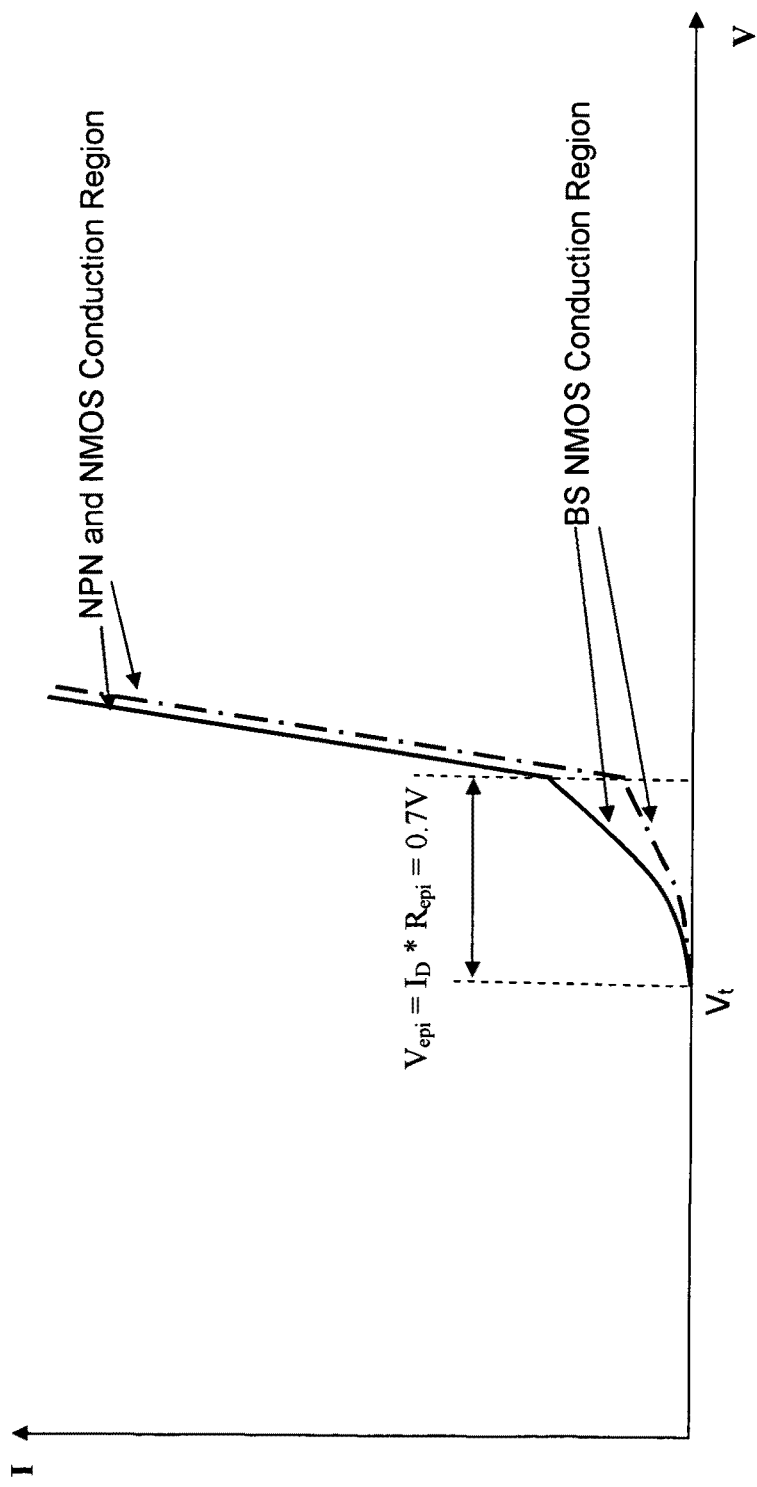
FIG. 4C is the I-V diagram for showing the performance of the TVS structure of FIGS. 4A and 4B in suppressing a transient voltage.

FIGS. 4A and 4B show a cross sectional view and the corresponding equivalent circuit elements respectively of a TVS device 100 of this invention. FIG. 4C is an I-V diagram that shows the current conduction and voltage characteristics of the TVS device 100. The TVS device 100 is formed in a N+ substrate 105 supporting a N-epitaxial layer 110 thereon with a anode terminal 115 disposed on the bottom and an cathode terminal 120 disposed on the top surface of the substrate that is contacted to a N+ drain/collector region 130. In addition to a TVS diode 150, the device also contains a NMOSFET 160 and a NPN bipolar transistor 170, as shown in the equivalent circuit 100. The connectivity of the terminals of the NMOS 160 and NPN bipolar transistor 170 in this structure are explained next. The TVS device structure 100 includes a surface P+ body contact region 135 on top of a P-body region 125. The surface P+ body contact region 135 is connected to the anode/source/emitter terminal using a body to source short 145 that ties the P body 125 to the cathode potential, by shorting P+ body contact 135 to N+ epi contact region 112 located in the N-epitaxial layer 110. The connection of the body to the anode terminal also includes a series resistance formed by the low doped N-epitaxial layer 110, which is shown in the equivalent circuit as $R_{epi}$. A diode 150 is also formed from the anode terminal 115 to the cathode terminal 120 at the PN junction of the P-body 125 and drain region 130. This diode 150 turns on when there is a negative voltage transient on the cathode terminal, and provides a path for current.

The TVS structure 100 further includes trench gates 140 padded with trench gate oxide layer, 142 to function with the anode 115, i.e., source, and the cathode 120, i.e., drain, electrodes and P-body region 125 as a bottom source (BS) NMOS transistor 160 for triggering the NPN Zener clamping circuit 170 formed between the N+ drain regions 130, the P-body regions 125 and the N-epitaxial layer 110 (and N+ substrate 105). As opposed to typical vertical MOSFETs, the source of NMOS 160 is on the bottom, at the N+ substrate 105, the source being shorted to the body 125 through the body to source short 145, body contact 135, N+ epi contact region 112 and epitaxial layer 110. The cathode terminal 120 shorts the trench gate 140 to the N+ drain region 130, which makes the gate and drain have the same potential.

$$Vgs=Vds$$

where Vgs is gate-to-source voltage and Vds is drain-to-source voltage. As is well known in the art, a MOSFET is in saturation mode when:

$$Vds \geq Vgs-Vt$$

And $$Vgs>Vt$$

where Vt is the threshold voltage of the MOSFET 160. Therefore, whenever the MOSFET 160 is turned on (i.e., Vgs>Vt), it is always operating in saturation mode. Shorting the gate 140 to the drain 130 essentially configures the MOSFET 160 into a two terminal device and gets a stable and adjustable trigger voltage.

The N+ drain region 130 also acts as the collector region for the NPN transistor. Likewise, the P body region 125 also acts as the base, and the N-epi 110 and N+ substrate 105 act as the emitter of the NPN transistor.

FIG. 4C is an I-V diagram for showing the operation of the TVS circuit 100. The device turns on for a cathode bias larger than the NMOS threshold voltage Vt, and shows two modes of current conduction, Since the gate voltage Vgs is tied to the drain voltage Vds by the anode electrode 120, the bottom source NMOS 160 is off for cathode bias Vds smaller than the NMOS threshold voltage Vt, and gets triggered when the voltage on the cathode electrode 120 reaches a threshold voltage Vt. The triggering voltage of the TVS device 100 may be easily adjusted by changing the threshold voltage Vt of the NMOS. This way, a very low triggering voltage can be attained. In the first mode of current conduction, current flow happens through the MOS channel created along the trench gate 140 sidewall in P body region 125 and connecting the drain N+ region 130 to the N-epitaxial region 110. In this mode all the current is drain current, $I_D$, of the NMOS 160. The presence of the low doped N-epitaxial region 110 provides series resistance $R_{epi}$ to the current flow, resulting in voltage drop $V_{epi}=I_D*R_{epi}$ across the N-epi 110 during the current flow. The I-V profile of the first mode of current conduction depends on both the drain current $I_D$, and the $R_{epi}$. This results in the forward biasing of the PN junction formed by the P base region 125 of the NPN transistor 170 and the N+ source 105 (and N-epi 110), and when this voltage drop $V_{epi}$ reaches the typical value of 0.7 Volts, it turns on the NPN transistor 170. At this point, the device enters the second mode of current conduction, as shown in the I-V curve, during which current conduction is shared by the NMOS 160 and the NPN bipolar transistor 170. In this mode of operation, the device achieves excellent clamping voltage with a small differential Rds due to minority carrier injection in the low doped N-epitaxial layer 110 by the NPN transistor 170 resulting in conductivity modulation. As a side note, all MOSFETs inherently have a parasitic bipolar transistor (formed by the Source-Body-Drain). In typical MOSFETs, it is highly undesirable to trigger this parasitic bipolar transistor. However in the current invention, the MOSFET is purposely used to trigger a bipolar transistor.

Figure 5A:
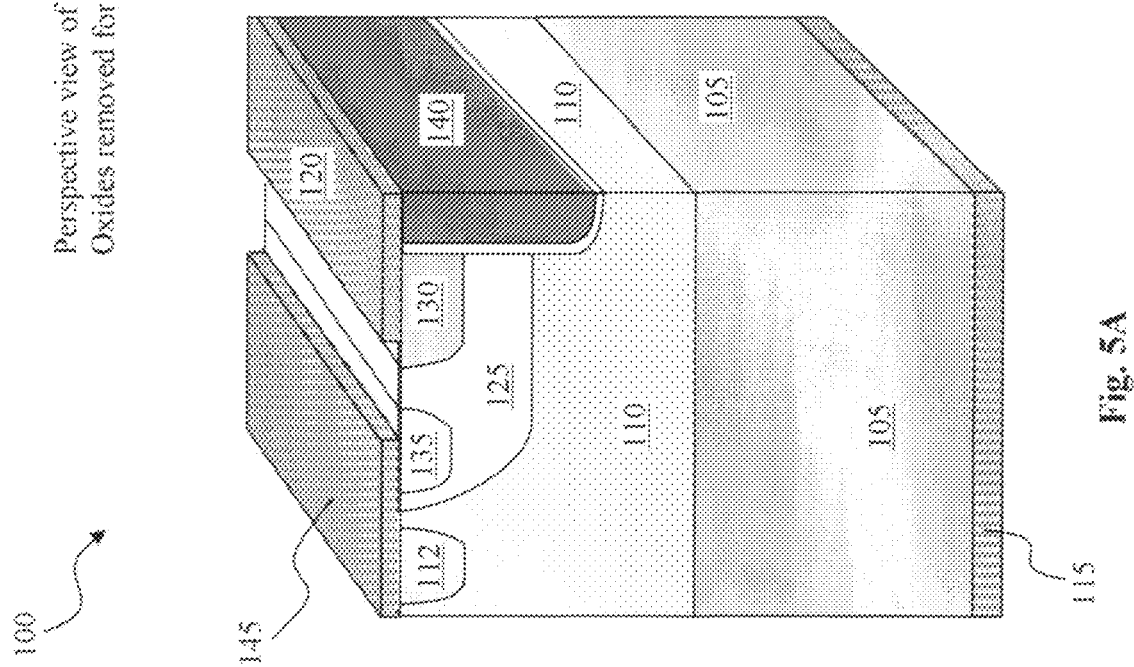
FIG. 5A is a perspective view for showing the TVS device structure of FIG. 4A.
Figure 5B:
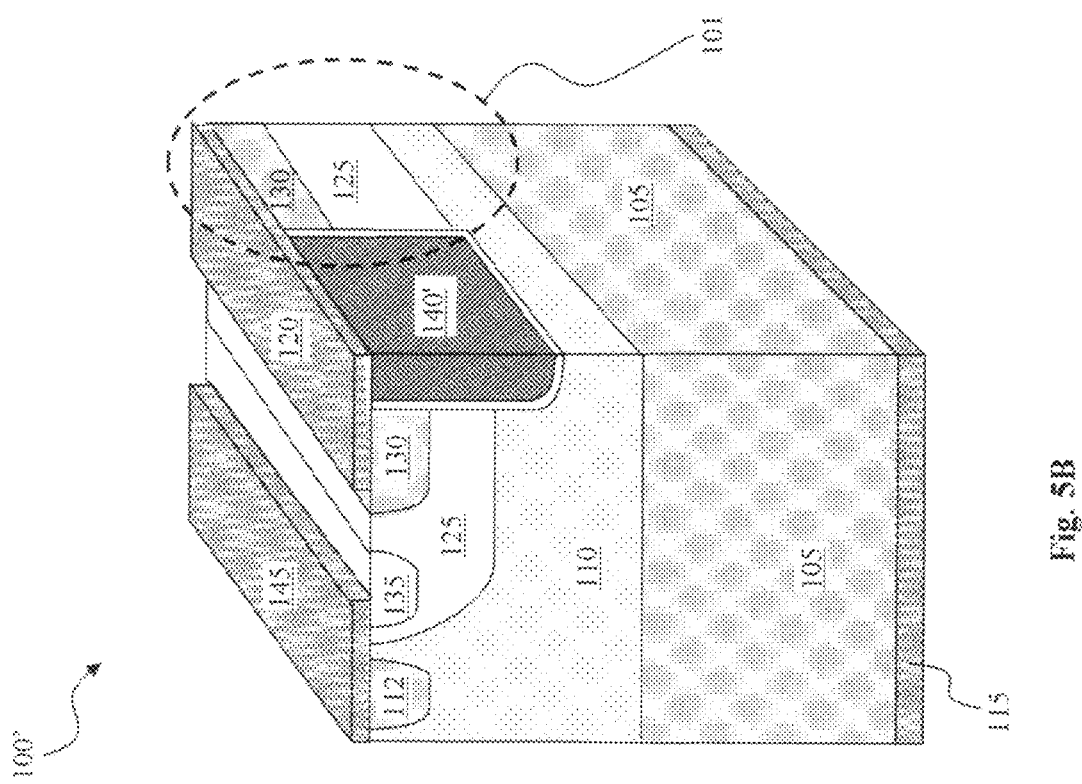

A perspective view of the TVS device 100 is shown in FIG. 5A. The top oxides are not shown in this view for simplicity. The ratio of the NMOS vs NPN area can be modified by breaking the NMOS channel in the $3^{rd}$ dimension, as shown in the TVS device 100' of FIG. 5B which illustrates an alternate embodiment of this invention. This technique can be used to adjust the current $I_D$ allowed by the NMOS 160. The amount of NMOS area determines the channel width of the NMOS 160, which in turn determines the current flow $I_D$. TVS device 100' is the same as TVS device 100 of FIG. 5A, except that the width of the trench 140' is truncated to provide more area for the NPN bipolar transistor 170, and to decrease the area of the NMOS 160. This extra area for the NPN bipolar transistor 170 is indicated by the dashed line 101. Decreasing the area of the NMOS 160 will lower the current needed to trigger the NPN bipolar transistor 170. The different I-V curves shown in FIG. 4C demonstrate such a change. Another technique to tweak the I-V characteristics is to change the epi series resistance $R_{epi}$, which can be done by adjusting the doping concentration of the epitaxial region 110.

This invention is not limited to trench gate devices, but can also be applied to any type of bottom source device, as shown in the cross sectional figure of TVS device 100" in FIG. 5C. TVS device 100" has a planar gate electrode 140" and gate oxide 142" structure, rather than a trench gate. The gate electrode 140' and the drain 130 may be connected in the third dimension. FIG. 5D shows another alternative embodiment of this invention in which the body-source short 145''' of TVS device 100''' is located in the third dimension rather than in each cell like FIG. 4A. The body-source short 145''' shorts the P+ body contact 135''' to the N+ epi contact region 112''' in the third dimension.

Although the present invention has been described in terms of the presently preferred embodiment, it is to be understood that such disclosure is not to be interpreted as limiting. For example, though the descriptions above describes a TVS device using a NMOSFET and a NPN transistor, the invention could also be extended to a TVS device having opposite polarity, e.g., a PMOSFET and a PNP transistor. The conductivity types of each region would simply be reversed, as shown in TVS device 200 of FIG. 6A. TVS device 200 is the same TVS device 100 of FIG. 4A, but the conductivity type of each region is reversed. FIG. 6B shows an equivalent circuit diagram of the TVS device 200. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A low voltage transient voltage suppressing (TVS) device supported on a semiconductor substrate supporting an epitaxial layer thereon, said TVS device further comprising:
 a bottom-source metal oxide semiconductor field effect transistor (BS-MOSFET) comprising a gate disposed adjacent to a drain region encompassed in a body region disposed near a top surface of said epitaxial layer wherein said epitaxial layer and semiconductor substrate functioning as a bottom source region of said BS-MOSFET and said drain region encompassed in said body region on top of said epitaxial layer constituting a bipolar transistor with a top electrode disposed on said top surface of said semiconductor substrate functioning as a drain/collector terminal and a bottom electrode disposed on a bottom surface of said semiconductor substrate functioning as a source/emitter electrode;

said body regions being electrically connected to a body-to-source short-connection connecting said body region to said source region; and said drain/collector terminal is connected to said drain region and wherein said gate turning on said BS-MOSFET upon application of a threshold voltage of said BS-MOSFET thus triggering said bipolar transistor for clamping and suppressing a transient voltage substantially near a threshold voltage of said BS-MOSFET.

2. The TVS device of claim 1 wherein:
said semiconductor substrate comprises a heavily doped N-type semiconductor substrate and supporting an N-type epitaxial layer thereon for disposing a bottom source N-channel MOSFET in parallel to an NPN bipolar transistor.

3. The TVS device of claim 1 wherein:
said TVS device clamps said transient voltage at a voltage below approximately three volts (3V).

4. The TVS device of claim 1 wherein:
said gate having a truncated length along a third dimension of said semiconductor substrate for reducing a total area of said BS-MOSFET and increasing a total area of said bipolar transistor.

5. The TVS device of claim 1 further comprising:
a surface body contact region at the top of the body region electrically connected to a metal layer on a top surface of said semiconductor substrate functioning as said body-to-source short-connection.

6. The TVS device of claim 5 wherein:
said surface body contact region electrically connected to a highly doped contact region disposed in said epitaxial layer as a part of said body-to-source short-connection thus electrically shorting said body region to said source region.

7. The TVS device of claim 1 wherein:
said semiconductor substrate comprises a heavily doped P-type semiconductor substrate supporting a P-type epitaxial layer thereon for disposing a bottom source P-channel MOSFET in parallel to a PNP bipolar transistor.

8. The TVS device of claim 1 wherein:
said gate is a trench gate.

9. The TVS device of claim 1 wherein:
said gate is a planar gate.

10. A transient voltage suppressing (TVS) device comprising:
a bipolar transistor functioning as a Zener clamp for suppressing a transient voltage; and
a bottom source metal oxide semiconductor field effect transistor (BS-MOSFET) connected in parallel with said bipolar transistor for triggering said bipolar transistor;
said bipolar transistor and the bottom source MOSFET are vertical devices further comprising a drain/collector terminal on the top surface and a source/emitter terminal on the bottom surface,
the bottom source MOSFET triggers the bipolar transistor upon a transient voltage event.

11. The TVS device of claim 10 further comprising:
a body-to-source short disposed on a top surface of the TVS device.

12. The TVS device of claim 10 wherein:
the drain/collector terminal is also shorted to a gate of said bottom source MOSFET.

* * * * *